United States Patent
Simola et al.

(10) Patent No.: US 7,463,024 B2
(45) Date of Patent: Dec. 9, 2008

(54) METHOD AND DEVICE FOR PROCESSING A MULTI-CHANNEL MEASUREMENT OF MAGNETIC FIELDS

(75) Inventors: Juha Simola, Helsinki (FI); Matti Kajola, Helsinki (FI); Samu Taulu, Helsinki (FI)

(73) Assignee: Elekta Neuromag Oy (FI)

( * ) Notice: Subject to any disclaimer, the term of this patent is extended or adjusted under 35 U.S.C. 154(b) by 236 days.

(21) Appl. No.: 11/220,415

(22) Filed: Sep. 7, 2005

(65) Prior Publication Data
US 2006/0031038 A1    Feb. 9, 2006

Related U.S. Application Data

(63) Continuation of application No. PCT/FI2004/000144, filed on Mar. 11, 2004.

(30) Foreign Application Priority Data
Mar. 14, 2003    (FI) ................................. 20030392

(51) Int. Cl.
 *G01R 33/22* (2006.01)
(52) U.S. Cl. ...................... 324/247; 324/244
(58) Field of Classification Search ............... 324/202, 324/225, 244, 247, 248, 260; 702/85, 127; 600/409
See application file for complete search history.

(56) References Cited

U.S. PATENT DOCUMENTS

| | | | |
|---|---|---|---|
| 4,492,923 A | 1/1985 | Byram | |
| 4,977,896 A | 12/1990 | Robinson et al. | |
| 5,020,538 A * | 6/1991 | Morgan et al. | 600/409 |
| 5,136,242 A | 8/1992 | Abraham-Fuchs | |
| 5,644,229 A | 7/1997 | Dössel et al. | |

(Continued)

FOREIGN PATENT DOCUMENTS

EP    0 560 621 A2    9/1993

(Continued)

OTHER PUBLICATIONS

G.T. Gullberg et al., "Backprojection filtering algorithms for reconstruction of vector and second order tensor fields", Nuclear Science Symposium Conference Record, 2000 IEEE, Published Oct. 15-20, 2000.

(Continued)

*Primary Examiner*—Jay M Patidar
(74) *Attorney, Agent, or Firm*—Studebaker & Brackett PC; Donald R. Studebaker

(57) ABSTRACT

A method and device by means of which an irrotational, sourceless vector field can be expressed by a number of physically reasonable basis vectors. In the method and device for processing a multi-channel measurement of magnetic fields of the present invention, measured signals can be unambiguously divided into signals of the irrotational, sourceless vector field that are caused by an interesting object or external interferences, as well as into a signal caused by the nonideality of the measuring device. The invention is based on the combining of two very fundamental mathematical regularities and applying in the processing of signal vectors of a multi-channel measuring device that measures an irrotational, sourceless vector field. The invention is based on the Maxwell's equations of an irrotational, sourceless vector field, as well as on the convergence characteristics of series developments.

37 Claims, 2 Drawing Sheets

Figure 1:
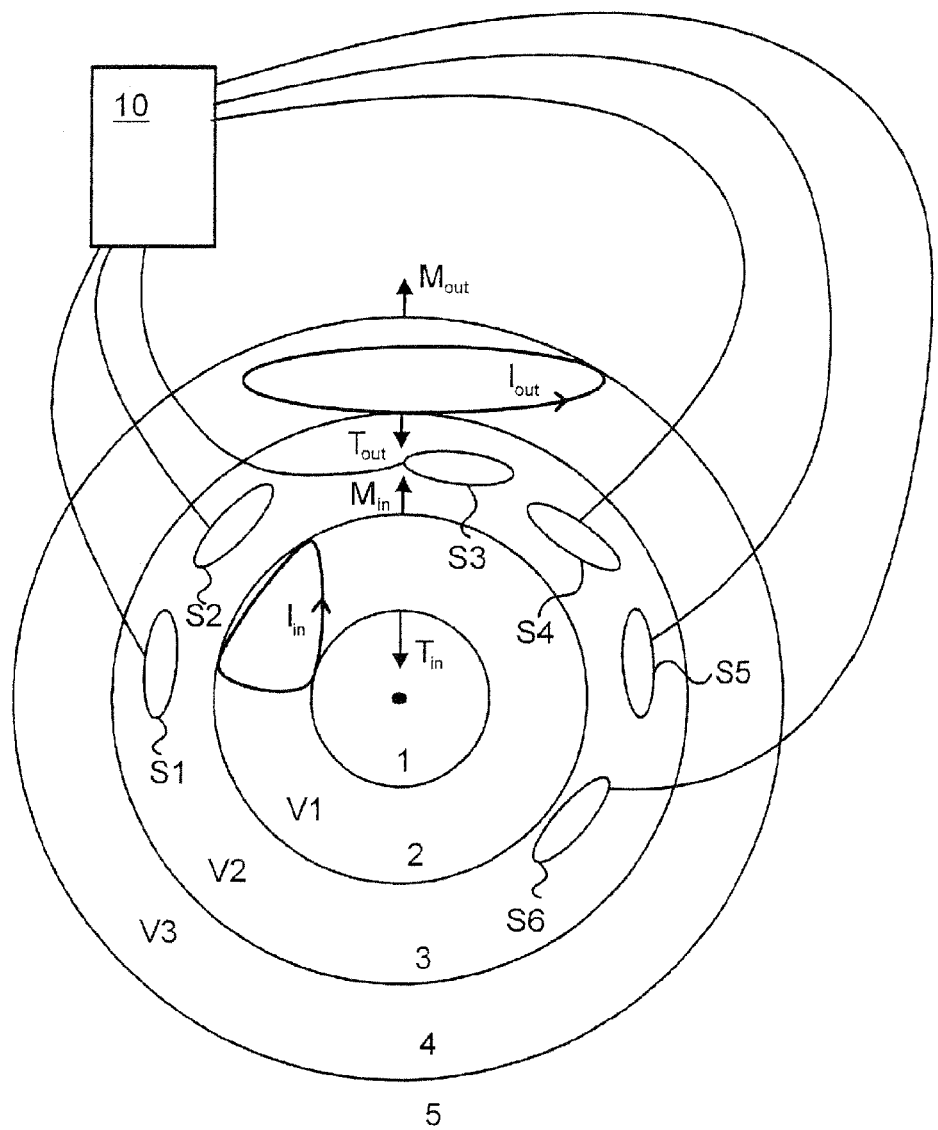

U.S. PATENT DOCUMENTS 6,538,436 B1 * 3/2003 Simola et al. ............... 324/248

FOREIGN PATENT DOCUMENTS

EP 0 560 621 A3 9/1993
FI 925461 5/1994

OTHER PUBLICATIONS

"Magnetoencephalography—theory, instruction, and applications to noninvasive studies of the working human brain", Mati Hämäläinen et al. Reviews of Modern Physics, vol. 65, No. 2, 1993.

"Interpretation of Neuromagnetic Measurements: Modeling and Statistical Considerations", Matti Hämäläinen, 1987.

"Comparability of Measurement Results Obtained with Multi-SQUID-Systems of Different Sensor Configurations", M Burghoff et al. IEEE Transactions on Applied Superconductivity, vol. 7, No. 2, 1997.

"Signal-space projection method for separating MEG or EEG into components", M.A. Uusitalo and R.J. Ilmoniemi, Medical & Biological Engineering & Computing, vol. 35, pp. 135-140, 1997.

"Detecting and Correcting for Head Movements in Neuromagnetic Measurements", K. Uutela et al, NeuroImage, vol. 14, pp. 1424-1431, 2001.

"Transformation of Multichannel Magnetocardiographic Signals to Standard Grid Form", Jussi Numminen et al. IEEE Transactions on Biomedical Engineering, vol. 42, No. 1, 1995.

Sabaka et al., A comprehensive model of the quiet-time, near-Earth magnetic field: phase 3; Geophys. J. Int. (2002) 151, 32-68.

* cited by examiner

METHOD AND DEVICE FOR PROCESSING A MULTI-CHANNEL MEASUREMENT OF MAGNETIC FIELDS

FIELD OF THE INVENTION

The present invention relates to a new and advanced method and system for processing a multi-channel measurement signal. In particular, the present invention relates to measurement geometry that measures a sourceless, irrotational vector field, which measurement geometry consists of a sensor arrangement; the invention also relates to the formation of a basis for signal space and the utilisation of the basis in the pre-processing and analysis of data measured by the measurement geometry.

BACKGROUND OF THE INVENTION

The representation of measurement signals or signal vectors measured by multi-channel measuring devices in some natural signal space basis is useful from the point of view of the analysis and illustration of the measured phenomenon. For example, in the case of a multi-channel magnetometer, one such basis can be obtained by modeling the source that produced the magnetic field by a current distribution whose total amplitude is the smallest possible one among the distributions that are capable of producing the measured signal vector and which current distribution has been limited within a conductor area that describes the object to be examined. This kind of method is called a minimum norm estimate and it has been described e.g. in publication "Magnetoencephalography—theory, instrumentation, and applications to non-invasive studies of the working human brain", Matti Hämäläinen et al *Reviews of Modern Physics*, Vol. 65, No. 2, 1993. In practice, due to the numerical sensitivity, the modeling of signal vectors by minimum norm estimate requires regularisation whose intensity depends, for each case specifically, on the signal-to-noise ratio and on the distribution of the vector field often in a non-obvious manner. Thus, the use of minimum norm estimate requires consideration and good expertise because a wrong regularisation may lead to a completely erroneous modeling. Another problem associated with the minimum norm estimate is that it tends to model also external interferences in the source distribution of an object to be examined, which leads to an erroneous outcome. In addition, the minimum norm estimate is a rather laborious operation computationally.

The source distribution that produced the vector field has also been modelled by means of a multi-pole development, but in that case, the source model has usually not been formed to be the basis for signal space. At a theoretical level, the formation of a basis based on a multi-pole development has been presented in the doctoral thesis "Interpretation of Neuromagnetic Measurements: Modeling and Statistical Considerations", Matti Hämäläinen, 1987, in which the basis is designed to describe the magnetic field outside an area containing the source distribution. The multi-pole development has also been used for source modeling in magnetocardiography, but in that case one has not formed a basis for signal space of the development. This is apparent e.g. from the publication "Comparability of Measurement Results Obtained with Multi-SQUID-Systems of Different Sensor Configurations", M. Burghoff et al, *IEEE Transactions on Applied Superconductivity*, Vol. 7, No. 2, 1997. The formation of the basis for signal space based on the series development of the vector field is reasonable only if the measuring device is a sufficiently multi-channel one and appropriate with respect to its geometry to ensure a susceptibility to interference as small as possible.

External interferences e.g. from the magnetic fields caused by the electric conductors situated near the measurement space are easily summed up in subtle magnetometer measurements. The elimination of the external interferences from the measured signals is important in order that one could obtain information as dependable as possible from the object to be examined. Conventionally, as the interference elimination methods, projection and reference signals methods have been used. In the former method, the interference elimination is based upon information on signal subspace spanned by known interferences, and in the latter one upon signals measured by correctly placed reference sensors, which signals are assumed to hive been caused merely by interference sources.

Of projection methods let it be mentioned the SSP projection method in which the sub-space caused by typical external interference sources is determined and the measured signals are projected against this orthogonally to the space. In addition to the interference, the projection also diminishes the actual interesting signal, in case the signal vectors produced by the object to be examined are not orthogonal to the interference sub-space, and furthermore, the SSP eliminates the interference completely only in cases in which the external interferences really belong to a predetermined interference sub-space. Also the illustration of the spatial distribution of the signals suffers from the projection. The SSP method has been described e.g. in patent publication F1925461 and in publication "Signal-space projection method for separating MEG or EEG into components", M. A. Uusitalo and R. J. Ilmoniemi, *Medical & Biological Engineering & Computing*, Vol. 35, pp. 135-140, 1997.

In reference signal methods, so-called reference sensors are installed in the measuring device in such places with respect to other sensors that they can be considered to measure solely external interferences without observing any signal from the object to be measured. Taking into account the geometry between the reference and the actual signal channels, the signals associated with the external interferences can be calculated and reduced from the signals measured by the signal channels, in which case just the signal relating to the object to be measured is remaining. This kind of method is justified only when the reference sensors are capable of measuring all the information relating to the external interferences in the area of the signal sensors without, however, measuring the signal associated with the object at all. In other words, the method is based on an assumption according to which external interferences in the area of the measuring device are uniform, whereas the signals produced by the object to be measured are weakening very fast as the distance grows. The method based on the reference signals is described e.g. in patent publication WO9641209.

In addition to external interferences, one problem that distorts the signals is the possible movement of the object to be examined during the measurement. Lately, e.g. in magnetoencephalography there have been made excitation response measurements to testees who cannot keep their heads immovable during the measurement. An apparent solution is to reject from the signals to be averaged signals that correspond to such moments of time during which the head has been situated too far from some reference point. In this kind of method, the signal-to-noise ratio weakens due to the rejection of the responses particularly when the head moves much. In more advanced methods, the distortion caused by a movement can be corrected either by taking the into account the movement in the source modeling when using a distorted averaged signal, or by making the movement correction directly to the signals prior to averaging these. The latter method is better in that sense that as the outcome, a signal vector in an illustrative form is obtained. For this purpose, minimum norm estimate is used by determining the source distribution associated with every response to be averaged and by calculating from this a signal corresponding to some fixed location of head. The problem with the method is the computational slowness of the minimum norm estimate, the distorting effect of the external interferences, and the fact that the possibly great distance of the object to the measurement sensors may distort the result. Methods of correcting movements have been described e.g. in the publication "Detecting and Correcting for Head Movements in Neuromagnetic Measurements", K. Uutela et al, *NeuroImage*, Vol. 14, pp. 1424-1431, 2001.

The transformation of signal vectors from one measurement geometry to another is often necessary e.g. when comparing different measurements with one another. The question can be e.g. about the transformation of each measured signal vector into a signal vector of such a measuring device in which the measurement sensors are situated in determinate positions on the surface of some standard object. To calculate such virtual signals, the vector field must be divided into basis function components, based on which the virtual signals can be calculated by forming the basis of the vector field for the virtual set of sensors and by using estimated components to calculate the virtual signals. Conventionally, as the basis, a minimum norm estimate basis has been used, in which case the aforementioned regularisation and interference problems hamper the outcome. The use of the minimum norm estimate for calculating virtual signals has been described e.g. in the publication "Transformation of Multichannel Magnetocardiographic Signals to Standard Grid Form", Jussi Numminen et al, *IEEE Transactions on Biomedical Engineering*, Vol. 42, No. 1, 1995.

The modeling of the sources that produced the measured signal is typically implemented by parametrising the source model and by calculating the parameters e.g. by non-linear minimisation of the smallest square sum of the error in such a manner that the model and the measured signal correspond to each other as well as possible. In that case, in the minimisation algorithm one must perform the calculation of the parameterised model for each measurement sensor specifically, which results in a big number of arithmetic operations when the number of sensors is big. One further problem is the difficulty of setting a good initial guesstimate for the model that would fasten the convergence of the minimisation algorithm towards the correct solution.

The inaccuracy of the information concerning the calibration coefficients and the geometry of the measuring device causes errors when analysing an object to be examined. In this sense the measuring device must be checked so that the measured signal vectors are compared to some expected result, in which case the calibration coefficients and the geometric parameters can be so set that the possible deviation from the expected result vanishes. Conventionally, in calibration methods one has used an exactly known signal source which is situated in a known position with respect to the measuring device. The problem with the method is that one must rely on the ideality of the signal source. Furthermore, calibration measurements of this kind often are cumbersome and time-consuming to perform.

OBJECTIVE OF THE INVENTION

The objective of the invention is to eliminate the drawbacks referred to above, or at least to significantly alleviate them. One specific objective of the invention is to disclose a new type of method by which the measured signal can be divided into signals associated with the object to be examined and into signals that can be classified as external interferences by means of a computationally very easy operation without the reference sensors. The division of the signal space into these two parts can be performed without foreknowledge of the signal sources, so the method functions correctly, although e.g. the signal sources that are outside the research object and cause interferences would change in a non-foreseeable manner. The signals due to the non-idealities of the measuring device can be separated from the interesting signals and interference signals because they are mainly not included in either one of the aforementioned parts of the signal space. In addition, in the method in accordance with the invention, there is no weakening of the interesting signal nor the illustration problems of signals resulting from this, which are typical of projection methods.

Further, the objective of the invention is to disclose a faster and more accurate method of compensation for movement which is used to correct the distortion of the signal vector caused by a movement of an object to be measured by at the same time correcting the distortion caused by external interferences without any additional calculation.

Further, the objective of the invention is to disclose a calculation method of virtual signals based on the fact that in the method, a vector field can be presented as components of the spatial series development of the field, which components can be limited to relate solely to the object to be examined. The components are used to represent the measured signal as a signal vector of any sensor geometry.

Further, the objective of the invention is to disclose a method of source modeling in which the source distribution of an object to be examined can be interpreted by means of the measured basis function values, and in some cases it can be solved analytically based on these values.

Further, the objective of the invention is to disclose a calibration method of a multi-channel measuring device that measures an irrotational vector field, which calibration method is capable of utilising any measured vector field without knowledge of the sources that produced the field. In this method, for the parameters of the system to be calibrated, such values are sought for that the measured signal mainly falls in that sub-space of signal space which is spanned by the basis functions of the irrotational, sourceless vector field. Thus, both the ambiguity associated with the sources and the amount of work associated with the preparation of the calibration measurement are eliminated from the calibration.

As for the features characteristic of the invention, reference is made to them in the claims.

DESCRIPTION OF THE INVENTION

The invention is based on the utilisation of two different sets of vectors in the modeling of a signal that originates from two different sources. The requirement is that the vector field to be measured is irrotational and sourceless. The vectors of the signal space in question consist of vector field samples taken in different places of the physical space or of their linear combinations. In particular, the present invention relates to a method which is used to form such a basis in which the information contained in the whole vector field can be expressed with a number of basis functions as small as possible, in the selection of which one has taken into account the irrotationality and sourcelessness of the vector field. By means of the basis functions in question, the vector field can be represented in a form enabling a more enhanced, accurate and versatile mathematical operation of the field than before in many signal processing and analytical applications.

Furthermore, the invention relates to a method the basic idea of which is to limit the degrees of freedom of the signal vectors of a measuring device that measures an irrotational, sourceless vector field based on the information on the irrotationality and sourcelessness of the field to be measured. In that case, the number of possible linearly independent signal vectors can be considerably reduced based on the limitations set by Maxwell's equations.

In one embodiment of the present invention, the signal to be measured is divided into components of two different series developments in such a manner that the series developments have different convergence characteristics in that sense that the signals produced by a first source, e.g. an object to be measured, and a second source, e.g. external interference sources, are included in the convergence areas of different series developments. In that case, a representation is obtained for the signal vectors in which the interesting signals and external interferences have different basis vectors, the co-ordinates corresponding to which can be unambiguously solved based on the measured signal.

As a definition of different spaces comprising relevant components regarding the present invention, volume V1 is the measurement volume where the interesting sources are located. Volume V2 represents the space containing the measurement sensors, where volume V1 is located inside volume V2. Furthermore, volume V3 represents the space where magnetic interference sources are located. Volume V3 is thus outside both volumes V1 and V2.

In one embodiment, the solution is performed by minimising e.g. by means of a linear operation the difference between a model based on series developments and the measured signal. In case the model describes an irrotational and sourceless vector field in the area of a measuring device sufficiently perfectly, the difference in question is due to a measurement error which results solely from the non-idealities of the measuring device. Thus, the method can divide the signals into three parts: into the interesting signals of the irrotational and sourceless vector field, into the signals of the irrotational and sourceless vector field that can be classified as external interferences, and into signals not included in the series development model and resulting from the non-idealities of the measuring device, such as e.g. noise and sources in the measurement area. It must be noted that specifically the claims mention a first and a second source, as well as a set of basis vectors, although their order is not important from the standpoint of the invention. Substantial is that the basis vectors describe vector fields originating from different sources as accurately as possible.

Thanks to the taking into account of the limitations set by the Maxwell's equations, the number of basis vectors needed in the representation of the signals is so small that a basis of this kind is practical for modern multi-channel measuring devices. In addition, the interpretation of the basis vectors is physically reasonable and there are a number of solutions of breaking up signal vectors into basis vectors formed in this manner. The following describes, with reference to FIG. 1, the characteristics and utilisation of the series developments. It must be noted that in all the phases, the limitations set by the Maxwell's equations are taken into account at the same time.

The present invention has the advantage that the method functions as an automatic interference elimination method in which the measurement sensors are not separately classified into signal channels and reference channels measuring merely interference signals, instead all the channels are in the same position when calculating the basis for signal space. The automatism of the interference elimination means that the method can model external interferences irrespective of the structure of the interference field in relation to the structure of the field produced by the object to be examined, or of the variation of the structure of the interference field with in respect of time, in contrast e.g. to the projection method in which the aforementioned signals are projected against some predetermined interference sub-space into an orthogonal space. In addition, in the projection method, also the signal produced by an object to be examined weakens, if it is not orthogonal to the determined interference sub-space. This is eliminated in the present invention.

Further, the method in accordance with the invention enables one to correct the signal distortions that are due to the movement of an object to be examined faster and more accurately than by previous methods, which is a basic requirement of a real-time correction for movement. The correction for movement is performed by representing the movement of an object to be examined as a movement of, the measurement sensors in the vicinity of a stationary object in such a manner that the variable geometry is taken into account when calculating the basis for signal space. In that case, the series development components corresponding to the object to be examined always are commensurable irrespective of the position of the object. The advantage of the invention is based on the fact that the calculation of the series development components requires quite few computational operations and on the fact that the external interferences are modelled when calculating the values of the series development components. Thus, this enables one to quickly calculate dependable values for the series development components corresponding to an interesting source area, although the distance and position of the object with respect to the measurement sensors would considerably vary and although the field structure of the external interferences would vary during the measurement.

Further, as the series development components describe the field produced by the sources everywhere in the measurement volume V1, they can be used to calculate a signal which would be measured by any fictitious sensor disposed in the same space. Virtual signals of this kind are useful e.g. when there is a wish to represent the signal produced by an object to be examined always in the same geometry irrespective of the fact of where the object was really situated during the measurement in relation to the measurement sensors. In addition, in virtual signals, the proportion of measurement errors is smaller than in original signals, as in the method one has attenuated the portion that is not included in the set model of an irrotational, sourceless vector field. Even in the case of virtual signals, the invention has the advantage of separating external interferences from the signals of an object to be examined.

In addition, the method in accordance with the invention enables one to identify individual sensors the signal measured by which clearly differs from the series development model that is based on the signals of the whole set of sensors. Thus, the method enables even a real-time quality control of measurement channels and an automatic rejection based on the signal analysis. In addition, the co-ordinates of the signals with respect to a basis in accordance with the invention can be re-calculated after the rejection of channels that operate in a non-desired manner, which enables one to obtain a more accurate result for the co-ordinates.

Further, thanks to the invention, the calibration of a measuring device or of a measurement geometry becomes easier than before. The calibration method in accordance with the invention does not need a predetermined calibration source, instead it suffices that the measuring device is known to measure a sourceless and irrotational vector field. Advantageously, the calibration is performed by setting the calibration coefficients and geometric parameters of the measuring device so that the measured signal vectors fit in the sub-space spanned by the signal vectors that are determined by the series developments. In other words, the calibration is performed by minimising the difference between the measured signal vectors and the sub-space calculated for the signal vectors that were produced by an irrotational vector field, in contrast to the conventional methods which minimise the difference between the signal vectors and the signal vectors produced by a source that is known beforehand as accurately as possible. In the method in accordance with the invention, as the measured signals it is possible to use e.g. any signals produced by the sources in the environment, in which case the calibration can be performed completely automatically without any preparations of the measurement situation. Furthermore, the method is more accurate and dependable than the previous ones as the inadequacy of the information concerning the geometry of an object to be measured does not result in an error of the calibration.

The invention can also be utilised in source modeling because the field components calculated irrespective of the external interferences and corresponding to the target area to be examined represent the continuous current distribution of the target area as a finite number of components so that each component describes some feature concerning the shape of a current distribution. In particular, the components can be used to check the hypotheses concerning the current distribution by comparing the modelled components to the theoretically calculated components of the distributions in accordance with the hypotheses. In some cases, this kind of comparison is easier than when using as the measurement result, the measured signal vector values, as it is done in several conventional methods. In some cases, it is possible to analytically calculate from the series development components the geometry of the current distribution without non-linear minimisation algorithms, which makes the determination of the distribution clearly faster than in the previous methods.

The invention also provides a new way of designing the geometry or set of sensors of a measuring device by optimising the capability thereof to dependably measure the series development components of an interesting object up to an order as high as possible by maximising at the same time the difference of the signal spaces associated with the object of the measuring device in question and the external interferences, such as e.g. the angle between the spaces. In this manner it is possible to obtain a set of sensors which is capable of measuring even the most complicated signals in respect of their field shapes as accurately as possible, while at the same time separating the interesting signals from the external interferences.

LIST OF FIGURES

Figure 2:
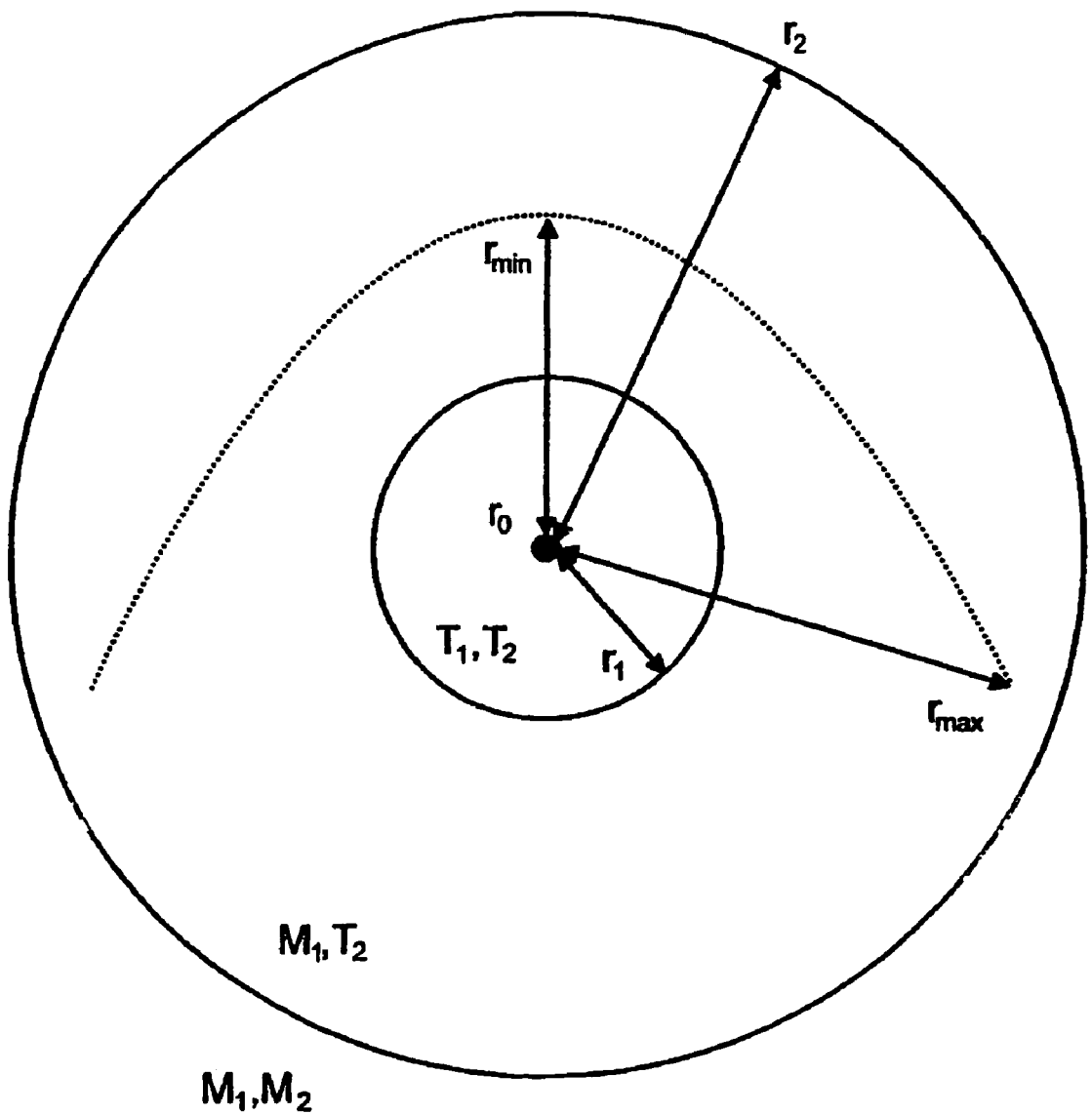

In the following, the invention will be described by means of detailed examples with reference to the accompanying drawing, in which FIG. 1 shows one generalised embodiment of the present invention; and FIG. 2 is a schematic representation illustrating one embodiment of the present invention.

DETAILED DESCRIPTION OF THE INVENTION

At first we describe the mathematical background of the invention with reference to FIG. 1. To illustrate the idea presented in this invention, in FIG. 1, the space has been schematically divided into five areas by means of concentric spherical shells. The sensors (s1, s2, s3, s4. s5, s6) of the multi-channel measuring device are situated in area 3, which is left in between the second and third innermost spheres. The sensors are connected to an analysis device 10. In area 2 there is a current loop $I_{in}$ which represents an interesting source of magnetic field situated in the measurement object. A current loop situated in area $I_{out}$ represents a source that produces external magnetic interferences. In other words, the interesting source is located in volume V1 (area 2), the measuring sensors in volume V2 (area 3) and the interfering source in volume V3 (area 4).

In the following, the representations of the field produced by these two sources are examined by such series developments the development point of which is the common midpoint of the spheres inside area 1. It is commonly known that the field produced by source $I_{in}$ can be represented as a Taylor's development which is convergent in area 1, which thus is such an area each point of which is closer to the development point than the closest source point. The field produced by source $I_{in}$ can also be represented as a convergent, asymptotic series development outside area 2, i.e. in an area in which all the points are farther from the development point than any source point.

An asymptotic series development is herein used to mean e.g. a series development that is based on spherical harmonics, the terms of which are proportional to the negative integer powers $r^{-n}$ of the distance r calculated from the development point. The same remarks also apply to a magnetic field produced by an external interference source $I_{out}$: the Taylor's series development thereof is convergent everywhere in areas 1, 2 and 3, whereas the asymptomatic series development is convergent in area 5.

As can be seen from FIG. 1, in area 3 containing the sensors (s1, s2, s3, s4, s5, s6), where the field is thus measured, the convergent series development of an interesting signal is asymptotic, whereas the convergent series development of an external interference in this area is the Taylor's series. When for the measured signal (signal space), both a Taylor's basis and a basis based on an asymptomatic series development are created, the signals coming from an interesting object can be separated from interferences coming from external sources based on the fact that the external interferences are mainly shown in the sub-space spanned by the basis vectors that are based on the terms of the Taylor's series, whereas the interesting signals are included in the sub-space determined by the basis vectors associated with the asymptomatic series.

In the following, one advantageous embodiment of the invention is shown with reference to FIG. 2. Let us think about a situation in which from the space, a point $\vec{r}_D$ is chosen in such a manner that the smallest and biggest distance of the measurement points from this are $r_{min}$ ja $r_{max}$, respectively.

The measurement points are designated in FIG. 2 as points on a curved surface. Let us assume that there are in the space two sources of an irrotational vector field, the first of which is situated at a distance $r_1 < r_{min}$ from point $\vec{r}_0$ and the latter at a distance $r_3 > r_{max}$ from point $\vec{r}_0$.

There is some series development T which is convergent inside such a sphere whose radius is the distance from the development point to the closest singular point, as well some other series development M which is convergent in an area which encompasses a space containing singular points. Thus, the vector field produced by source 1 can be expressed in the area of the measurement points as a development of the M series with respect to point $\vec{r}_0$, but not as a development of the T series, and correspondingly, the vector field produced by source 2 can be expressed in the area of the measurement points as a T development with respect to point $\vec{r}_D$, but not as an M development. Thus, the signal vectors produced by sources 1 and 2 can be separated from one another, if the measured signal vector is presented in a basis whose basis functions correspond to the independent components of the T and M development with respect to the chosen development point. It must be noted that the development point does not need to be the same for different series developments and that there are several different alternatives for the developments. It suffices that the convergence areas of the developments are the same as with the aforementioned T and M developments. The method described becomes general in a situation in which there are several sources both at distance $r_{in}<r_{min}$ and at distance $r_{out}>r_{max}$. The development point can be placed e.g. so that all the sources associated with the object to be examined are situated in area $r_{in}<r_{min}$ and the external interferences in area $r_{out}>r_{max}$. FIG. 2 shows two spheres which describe the convergence areas of the series developments. Inside the smaller sphere, the T developments of the vector fields produced both by source 1 and source 2 are convergent with respect to point $\vec{r}_0$ (designated with T1, T2). In the space between the smaller and the bigger sphere, the M development of the vector field produced by source 1 is convergent, and the T development of the vector field produced by source 2 is convergent (designated with M1, T2). Outside the bigger sphere, the M developments of the vector fields produced by both of the sources are convergent with respect to point $\vec{r}_D$ (designated with M1, M2). The fields produced by the sources can be separated based on the series developments in the space between the spheres, where also the measurement points are situated. Thus, when the signals of the measurement points are expressed at the same time both as the T and M series developments with respect to point $\vec{r}_0$, source 1 solely affects the signal through the components of the M development, and source 2 solely through the components of the T development.

If the aforementioned series development components form a linearly independent basis for signal space, then the interesting signals can be separated from the interferences independently. To reduce the effect of noise, one may have to use regularisation, in case the susceptibility to interference of the basis is big. Herein the susceptibility to interference is used to mean the product of the norms of the matrix and of its reverse matrix. The linear independence and the susceptibility to interference of the basis depend on the geometry of the measurement arrangement and on the number of the components to be modelled in relation to the number of measurement points. The invention provides a basis for the signal vectors of an irrotational vector field that is more practical than before and in which the regularisation means substantially the selection of the number of series development components to be included. This is easy to solve because of the fast attenuation of the components as the order of the development increases.

The following describes the division of the measured signal vectors into an object to be examined and into external interferences using as the example the Taylor's series development as well as the multi-pole development of the spherical harmonics. As the vector field being measured functions the magnetic flux density. Let it be assumed that the development point for the series developments can be selected in such a manner that the sources associated with the object to be measured are situated inside an r radial sphere, and the sources associated with the external interferences are situated outside an R radial sphere when the origin of both of the spheres is the development point in question. If $r<r_{min}$ and $R>r_{max}$, when $r_{min}$ and $r_{max}$ are correspondingly the smallest and the biggest distance of the development point to the measurement channels, then the division into interesting signals and external interference signals can be performed as shown in the following.

The Taylor's series development is convergent inside an R radial sphere when R is the distance from the development point of the series to the closest singular point, herein to a source. Thus, the signal vector $\vec{\phi}_{out}$ produced by a source $s_{out}$ situated at a distance $r_{out} \circ R$ can be expressed with respect to the development point by means of the Taylor series of the magnetic field, but the Taylor development is not convergent for a signal vector $\vec{\phi}_{in}$ produced by a source $s_{in}$ situated at a distance $r_{in} \circ r$. Instead, for $\vec{\phi}_{in}$ it is possible to use e.g. the multi-pole development. The signal measured on channel k is the surface integral of a normal component of the magnetic flux density over the measurement area. Now we consider the frequency without limiting the planar sensors, in which case the surface integral in question can be written in the following form:

$$\phi_k = \vec{n} \cdot \int_{S_k} \vec{b}(\vec{r}) dS_k \qquad (1)$$

The co-ordinates of the Cartesian co-ordinates are designated with symbols $x_1, x_2, x_3$. In that case, the Taylor development of the $x_1$ component of the magnetic flux density at the measurement point $\vec{r}_{kj} = [x_{kj} y_{kj} z_{kj}]^T$ is $$b_{xi}(\vec{r}_{kj}) = \sum_{m=0}^{nx} \sum_{l=0}^{ny} \sum_{p=0}^{nz} \frac{x_{kj}^m y_{kj}^l z_{kj}^p \partial^{(m+l+p)} b_{xi}}{m!\,l!\,p!\,\partial x^m \partial y^l \partial z^p}, \qquad (2)$$

wherein the partial derivative concerns the development point of the series development. Thus, $$\vec{b}(\vec{r}_{kj}) = G\vec{\rho}_{kj}, \qquad (3)$$

wherein $$G = \begin{bmatrix} b_x \dfrac{\partial b_x}{\partial x} \dfrac{\partial b_x}{\partial y} \dfrac{\partial b_x}{\partial z} & \cdots & \dfrac{\partial^{(nx+ny+nz)} b_x}{\partial x^{nx} \partial y^{ny} \partial z^{nz}} \\ b_y \dfrac{\partial b_y}{\partial x} \dfrac{\partial b_y}{\partial y} \dfrac{\partial b_y}{\partial z} & \cdots & \dfrac{\partial^{(nx+ny+nz)} b_y}{\partial x^{nx} \partial y^{ny} \partial z^{nz}} \\ b_z \dfrac{\partial b_z}{\partial x} \dfrac{\partial b_z}{\partial y} \dfrac{\partial b_z}{\partial z} & \cdots & \dfrac{\partial^{(nx+ny+nz)} b_z}{\partial x^{nx} \partial y^{ny} \partial z^{nz}} \end{bmatrix} \text{ and} \qquad (4)$$

$$\vec{\rho}_{kj} = [1\, x_{kj}\, y_{kj}\, z_{kj} \ldots (x_{kj}^{nx} y_{kj}^{ny} z_{kj}^{nz})/((nx)!(ny)!(nz)!)] \qquad (5)$$

Thus $$\phi_{outk} = \vec{n} \cdot G \int_{S_k} \vec{\rho}_{kj} dS_k, \qquad (6)$$

The integral expression of the previous equation is a vector, so it can be denoted as $$\phi_{out\kappa} = \vec{\eta}_\kappa \cdot G\vec{\rho}_\kappa, \quad (7)$$

in which case the signal vector produced by an external source is $$\vec{\phi}_{out} = \mathrm{diog}(N^T G P), \quad (8)$$

wherein $N = [\vec{n}_1 \ldots \vec{n}_N]$ and $P = [\vec{\rho}_1 \ldots \vec{\rho}_N]$.

The Maxwell's equations $\nabla \times \vec{b} = \vec{0}$ and $\nabla \cdot \vec{b} = 0$ that are valid in the measurement area limit the number of independent G matrixes in such a manner that in the Taylor development of nth order there are $n_T = (n+2)^2 - 1$ of independent terms, in which case each signal vector produced by external sources can be expressed as follows:

$$\vec{\phi}_{out} = \sum_{i=1}^{n_T} x_{Tl} \mathrm{diag}(N^T G_l P) = \sum_{i=1}^{n_T} x_{Tl} \vec{s}_{Tl}. \quad (9)$$

The basis formed by the signal vectors $\vec{S}_n$ is denoted by matrix $s_\tau$, in which case the signal vectors produced by external signal sources are of the form:

$$\phi_{out} = S_\tau \vec{x}_\tau. \quad (10)$$

In a multi-pole development, the magnetic scalar potential is expressed by means of so-called even and odd spherical harmonics. On the other hand, the magnetic flux density is the negative gradient of the potential in question, so herein $\vec{b}(\vec{r})$ can be expressed in the form:

$$\vec{b}(\vec{r}) = -\frac{\mu_0}{4\pi} \sum_{l=0}^{\infty} \sum_{m=0}^{l} \nabla \left[ \frac{1}{\|\vec{r}\|^{l+1}} (a_{lm} Y_{lm}^e(\theta, \varphi) + b_{lm} Y_{lm}^o(\theta, \varphi)) \right], \quad (11)$$

wherein $a_{lm}$ and $b_{lm}$ are multi-pole coefficients, and the even and odd spherical harmonics can be expressed by means of Legendre's polynome $P_{lm}(\cos\cdot)$ in the form $Y_{lm}^e(\theta,\phi) = P_{lm}(\cos\theta)\cos(m\phi)$ and $Y_{lm}^o(\theta,\phi) = P_{lm}(\cos\theta)\sin(m\phi)$.

The angles $\theta$ and $\phi$ are angles of bearing of the spherical co-ordinates. The redundancy due to the irrotationality and sourcelessness of the field is automatically noticed in a multi-pole development, and the dimension of the nth order multi-pole basis is $n_m = (n+1)^2 - 1$ when the mono-pole term (n=0) is not noticed. Now the basis vectors $\vec{s}_{ml}$ corresponding to the multi-pole development can be formed by the same principe as in the case of the Taylor basis, whereby a multi-pole basis $S_m$ is obtained. Thus, the signal vectors associated with an object to be examined are of the form:

$$\vec{\phi}_{in} = S_m \vec{x}_m \quad (12)$$

The actual main point of the invention is the combining of the bases $S_T$ ja $S_m$ into one basis for signal space in such a manner that $$S = [S_m S_T] \text{ and } \vec{x} = \begin{bmatrix} \vec{x}_m \\ \vec{x}_T \end{bmatrix},$$

whereby the measured signal vector can be represented in the form:

$$\vec{\phi} = \vec{\phi}_{in} + \vec{\phi}_{out} = S\vec{x} \quad (13)$$

This equation describes a signal vector measured by an ideal measuring device from an irrotational and sourceless vector field. In practice, a non-ideal measuring device produces into the model of an irrotational and sourceless vector field an inaudible measurement error $\vec{e}$, so by practical measuring devices the foregoing equation has to be written in the form:

$$\vec{\phi} = \vec{\phi}_{in} + \vec{\phi}_{out} = \vec{e} = S\vec{x} + \vec{e} \quad (14)$$

The series development components can be solved by minimising the difference between the measured signal and the model by the method of the smallest square sum, which in this case corresponds to the multiplying of the measured signal vector by the pseudo inverse of the matrix S:

$$\hat{x} = S^+ \vec{\phi} \quad (15)$$

The solution of an ideal case is unambiguous, in case the dimension of the measured signal vector $\vec{\phi}$ is bigger than the number of vector fields of the basis S and in case the basis S is linearly independent. These requirements are typically realised by present-day multi-channel measuring devices, if the limitations set by the Maxwell's equations are taken into account. Furthermore, to ensure an error-free estimate, a sufficiently big number of series development components must be included in the basis S. As these requirements are fulfilled, the measured signal-vector can always be divided into the part produced by an object to be measured, into the part produced by external interferences, and into the part not included in the irrotational vector field (measurement error)

$$\hat{\phi}_{in} = S_m \hat{x}_m, \quad (16)$$

$$\hat{\phi}_{out} = S_T \hat{x}_T, \quad (17)$$

$$\hat{e} = \vec{\phi} - S\hat{x} \quad (18)$$

The field of application of the invention is wide as in the method, from the measured signal vector, a natural representation is calculated containing substantially the same information as the signal vector, but in a form independent of the sensor geometry and typically in a lower-dimensional form than the measured signal vectors. Furthermore, the components associated with an object to be examined and with the external interferences are separate, unlike in the signal vector, which is the sum of an interesting signal and of interferences.

In the following, one implementation mode of the invention is described by means of an example. Let it be assumed that we wish to measure the magnetic field produced by the brain of a testee who does not keep his or head still, instead constantly moves in the vicinity of the measuring device. Furthermore, interference sources external of the testee's head are associated with the measurement situation, the structure of the magnetic field produced by which changes as a function of time. Interference sources of this kind can be e.g. the magnetic particles, in a moving testee's clothes and the testee's heart.

The magnetic field measurements of the brain, are usually made as repetition measurements in which the response produced by the brain and relating to the desired stimulus is averaged several times in a row to improve the signal-to-noise ratio. In the case of the testee described above, the averaged signal vector to be obtained as the outcome is the mean value of the signal vectors produced by a source that was situated in different places and is physiologically invariable from one stimulus to another, and thus the average signal cannot be used in the analysis as such. Furthermore, the elimination of external interferences by a projection method based on a predetermined interference sub-space is out of the question, since the field structure of the interferences has varied in a non-foreseeable manner. An interference elimination based on separate reference sensors is not justified either, since the testee can time to time be far from both the actual signal and reference sensors, whereby a division into an interesting signal and interferences that is based on shear uniformity of the field or on a signal amplitude is not very successful. Instead, the interference elimination can be performed by the series development method described above by averaging the component estimates associated with an interesting object, in the calculation of which one has taken into account the place and position of the testee with respect to the measuring device at different moments of time.

The motion of a testee is modelled in such a manner that the motion of the head is represented as a motion of a set of sensors in the environment of an immovable head. In that case, at a moment of time t basis matrixes $S_m(t)$ and $S_T(t)$ are calculated, from which a basis $S(t)$ is formed, based on which it is possible to calculate, by the pseudo inverse, an estimate $\hat{x}(t)$ in accordance with equation 15. When the co-ordinates of the measuring device are connected to the co-ordinates of a stationary head, the portion $\hat{x}_m(t)$ of the component estimate $\hat{x}(t)$ associated with the object in independent of the testee's motion. Thus, instead of the averaging of the signal vectors associated with the stimuli it is worth averaging the estimates $\hat{x}_m(t)$ whose mean value contains the same information as the mean value of the signal vectors, but without the distortion caused by the testee's motion. The outcome of a repetition measurement is thus a performed correction for movement and an automatic elimination of external interferences, so the mean value can be used as such for the analysis without other pre-processing operations.

One analysis method includes the use of multi-pole components in source modeling, which is particularly useful when the source distribution associated with an object to be examined can be solved analytically from the estimated components. This is successful at least in a case in which the field is produced by one current dipole inside a spherical volume conductor. On the other hand, the outcome can also be represented as a virtual signal vector of any sensor geometry by calculating the basis $S_m$ of the sensor geometry in question, whereby the virtual signal vector is obtained in accordance with equation 16 by using an averaged estimate $\hat{x}_m$.

As in the calculation of the component estimates one must use information on the geometry and calibration coefficients of the measuring device, it is important that the geometric parameters and the calibration coefficients are known as accurately as possible. In the method of the invention, these are found out by solely utilising the information on the fact that the measuring device measures an irrotational vector field. In that case, each measured signal vector shall be included in the sub-space S, and systematic deviations from this condition refer to an incomplete piece of information on the calibration and geometry of the measuring device. Thus, the calibration can be performed by setting the calibration coefficients and the geometric parameters so that the sub-space S calculated based on these corresponds to the sub-space spanned by the measured signal vectors.

The invention is not limited merely to the examples of its embodiments, instead many variations are possible within the scope of the inventive idea defined by the claims.

The invention claimed is:

1. A method for analysing a magnetic signal or field registered by a multi-channel measuring device in a geometry in which an interesting source is in measurement volume V1, sensors measuring the field or components thereof outside volume V1 inside volume V2, and the sources of magnetic interferences outside volume V1 and V2 in volume V3, where V3 is infinite or finite, comprising:

parametrising in volume V2 the magnetic field produced by the interesting sources disposed in volume V1 as a sum of elementary fields, where each elementary field is irrotational, sourceless and finite outside volume V1, in such a manner that for the parametrised magnetic field, a representation of the desired accuracy in volume V2 is obtained; and parametrising in volume V2 the magnetic field produced by the interference sources disposed in volume V3 as a sum of elementary fields, where each elementary field is irrotational, sourceless and finite outside volume V3 in such a manner that for the parametrised field, a representation of the desired accuracy in volume V2 is obtained; and calculating the signal vector of the measuring device corresponding to each elementary field; and measuring the magnetic signal by sensors; and separating the fields that were produced from sources disposed in different volumes by calculating the components of the measured signal vector in the basis formed by the signal vectors associated with the elementary fields.

2. The method as defined in claim 1, wherein the signal vector is formed as a sum of the desired components of the measured signal vector.

3. The method as defined in claim 1, wherein the signal vector is formed as a sum of the desired components of the measured signal vector in a set of sensors which is in a position deviating from its position during the measurement with respect to the interesting source.

4. The method as defined in claim 1, wherein the signal vector is formed as a sum of the desired components of the measured signal vector in such a set of sensors which deviates from the set of sensors used in the measurement with respect of its geometry.

5. The method as defined in claim 1, wherein as the elementary fields associated with the sources disposed in volume V1 and volume V3, the fields associated with the terms of the series development that represents the harmonic potential of two fields that are convergent in the measurement space on different conditions are used, whereby the magnetic signals originating from volume V1 and volume V3 are separated as sets of basis vectors of their own.

6. The method as defined in claim 5, wherein the series development estimating the field potential generated from the sources disposed in each volume V1 and V3 is selected so that it is convergent in volume V2 as fast as possible, in which case a number of basis vectors as small as possible suffices to obtain a description as accurate as possible for the signals caused by different sources.

7. The method as defined in claim 5, wherein as the series development estimating the field potential generated from the sources disposed in each volume V1 and V3, either the Taylor's series, the series based on spherical harmonics or other applicable series is chosen.

8. The method as defined in claim 1 or 7, wherein in the selection of the elementary fields, the redundancy due to the harmonics of the potential is taken into account.

9. The method as defined in claim 5, wherein the development point or points of the series developments are chosen from volume V1 or V3.

10. The method as defined in claim 1, wherein the signal corresponding to the signal source disposed in volume V1 or the signal corresponding to the signal source disposed in volume V3 is separated from the measurement signal as a function of time.

11. The method as defined in claim 1, wherein the components of the measured signal vector in the basis formed by the signal vectors associated with the elementary fields are deducted from the measurement signal, in which case the separation signal corresponds to the signal originating from volume V2.

12. The method as defined in claim 11, wherein the signal originating from volume V2 is registered as a function of time.

13. The method as defined in claim 11, wherein a channel that functions in a non-desired manner is identified by means of the separation signal.

14. The method as defined in claim 13, wherein the identified channel functioning in a non-desired manner is taken into account in the further analysis with a weighting coefficient different with respect to the other channels.

15. The method as defined in claim 1, wherein the motion of the source is perceived, and based on this information, the elementary fields associated with the source are represented in the co-ordinates of the source.

16. The method as defined in claim 1, wherein the interesting sources are in volume V3 and the interference sources in volume V1.

17. The method as defined in claim 15, wherein the change is perceived by monitoring the place of a known signal source arranged in a first or second space with respect to the measurement geometry.

18. A device for analysing a magnetic signal or field registered by a multi-channel measurement device, the device comprising:
a set of sensors (s1, s2, . . . sn); and
an analysis device (10) to which the sensors are connected, in which case the measurement is arranged in a geometry in which the interesting source is in measurement volume V1; the sensors measuring the field or components thereof outside volume V1 in volume V2; and the sources of the magnetic interferences outside volume V1 and V2 in volume V3, where V3 is infinite or finite, wherein the analysis device is arranged to
parametrise in volume V2 the magnetic field produced by the interesting sources disposed in volume V1 as a sum of elementary fields, where each elmentary field is irrotational, sourceless and finite outside volume V1 in such a manner that for the parametrised magnetic field, a representation of the desired accuracy in volume V2 is obtained; and
parametrise in volume V2 the magnetic field produced by the interference sources disposed in volume V3 as a sum of elementary fields, where each elementary field is irrotational, sourceless and finite outside volume V3 in such a manner that for the parametrised field, a representation of the desired accuracy in volume V2 is obtained;

calculate the signal vector of the measuring device corresponding to each elementary field; and
measure the magnetic signal by sensors; and
separate the fields that were produced from sources disposed in different volumes by calculating the components of the measured signal vector in the basis formed by the signal vectors associated with the elementary fields.

19. The device as defined in claim 18, wherein the signal vector is formed as a sum of the desired components of the measured signal vector.

20. The device as defined in claim 18, wherein the signal vector is formed as a sum of the desired components of the measured signal vector in a set of sensors which is in a position deviating from its position during the measurement with respect to the interesting source.

21. The device as defined in claim 18, wherein the signal vector is formed as a sum of the desired components of the measured signal vector in such a set of sensors which deviates from the set of sensors used in the measurement with respect to its geometry.

22. The device as defined in claim 18, wherein as the elementary fields associated with the sources disposed in volume V1 and volume V3, the fields associated with the terms of the series development that represents the harmonic potential of two fields that are convergent in the measurement space on different conditions are used.

23. The device as defined in claim 22, wherein the series development estimating the field potential generated from the sources disposed in each volume V1 and V3 is selected so that it is convergent in volume V2 as fast as possible, in which case a number of basis vectors as small as possible suffices to obtain a description as accurate as possible for the signals caused by different sources.

24. The device as defined in claim 22, wherein as the series development estimating the field potential generated from the sources disposed in each volume V1 and V3, either the Taylor's series, the series based on spherical harmonics or other applicable series is chosen.

25. The device as defined in claim 18 or 24, wherein in the selection of the elementary fields, the redundancy due to the harmonics of the potential is taken into account.

26. The device as defined in claim 22, wherein the development point or points of the series developments are chosen from volume V1 or V3.

27. The device as defined in claim 18, wherein the signal corresponding to the signal source disposed in volume V1 or the signal corresponding to the signal source disposed in volume V3 is separated from the measurement signal as a function of time.

28. The device as defined in claim 18, wherein the components of the measured signal vector in the basis formed by the signal vectors associated with the elementary fields are deducted from the measurement signal, in which case the separation signal corresponds to the signal originating from volume V2.

29. The device as defined in claim 28, wherein the signal originating from volume V2 is registered as a function of time.

30. The device as defined in claim 28, wherein a channel that functions in a non-desired manner is identified by means of the separation signal.

31. The device as defined in claim 30, wherein the identified channel functioning in a non-desired maimer is taken into account in the further analysis with a weighting coefficient different with respect to the other channels.

32. The device as defined in claim 18, wherein the motion of the source is perceived, and based on this information, the elementary fields associated with the source are represented in the co-ordinates of the source.

33. The device as defined in claim 18, wherein the interesting sources are in volume V3 and the interference sources in volume V1.

34. The device as defined in claim 18, wherein selecting a set of basis vectors corresponding to irrotational, sourceless elementary fields in measurement volume V2 ; and setting the calibration coefficients and geometric parameters of the measuring device to values which minimise the deviation of the signal vector from the signal space spanned by a basis in accordance with the set of basis vectors.

35. The method as defined in claim 32, wherein the change is perceived by monitoring the place of a known signal source arranged in a first or second space with respect to the measurement geometry.

36. The device as defined in claim 18, wherein just the desired components of the measured signal vector are saved.

37. The device as defined in claim 18, wherein in locating an interesting source, just the desired components of the measured signals are used.

* * * * *